(12) United States Patent
Masuda et al.

(10) Patent No.: US 6,281,697 B1
(45) Date of Patent: Aug. 28, 2001

(54) SEMICONDUCTOR DEVICE EVALUATION APPARATUS

(75) Inventors: Norio Masuda; Naoya Tamaki, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/339,399

(22) Filed: Jun. 23, 1999

(30) Foreign Application Priority Data

Dec. 4, 1998 (JP) .................................................. 10-346030

(51) Int. Cl.[7] ........................ G01R 31/26; G01R 31/303; G01R 33/02
(52) U.S. Cl. ........................ 324/765; 324/263; 324/750
(58) Field of Search .................................. 324/765, 529, 324/144, 750, 263

(56) References Cited

U.S. PATENT DOCUMENTS

| 5,465,046 | * | 11/1995 | Campbell et al. .................... 324/754 |
| 5,570,034 | * | 10/1996 | Needham et al. .................... 324/763 |
| 5,578,930 | * | 11/1996 | Sheen ................................... 324/530 |
| 6,064,220 | * | 5/2000 | Sugasawara et al. ................ 324/765 |

FOREIGN PATENT DOCUMENTS

| 3-015765 | 1/1991 | (JP) . |
| 7-063823 | 3/1995 | (JP) . |
| 10-38984 | 2/1998 | (JP) . |
| 10-082827 | 3/1998 | (JP) . |
| 11-72545 | 3/1999 | (JP) . |

OTHER PUBLICATIONS

Electromagnetic Compatibility Measurement Procedures for Integrated Circuits–Integrated Circuit Radiated Emissions Measurement Procedure 150kHz to 1000 MHz, TEM Cell, IEC 47A/429/NP New Work Proposal, Feb. 1996, pp. 27–42.

Electromagnetic Emission (EME) Measurement of Integrated Circuits, DC to 1 GHZ, IEC 47A/428/NP New Work Item Proposal, Feb. 1996, pp. 1–31.

* cited by examiner

*Primary Examiner*—Glenn W. Brown
(74) *Attorney, Agent, or Firm*—McGuireWoods LLP

(57) ABSTRACT

A semiconductor device evaluation apparatus is provided with a test board. A print wiring is provided at a first surface of the test board on which a semiconductor device is mounted. A terminal of the semiconductor device is connected to the print wiring. A power circuit is provided at a second surface opposite to the first surface of the test board. The power circuit is connected to the print wiring and actuates the semiconductor device. The apparatus is also provided with a magnetic field detector arranged above the print wiring and detects a magnetic field generated from the print wiring. Further, the apparatus is provided with a current detector detecting a value of current carried through the print wiring based on the magnitude of the magnetic field detected by the magnetic field detector.

14 Claims, 15 Drawing Sheets

US 6,281,697 B1

SEMICONDUCTOR DEVICE EVALUATION APPARATUS

BACKGROUND OF THE INVENTION

1. Field of the Invention

The present invention relates to a semiconductor device evaluation apparatus used for measuring current carried through the terminals of a semiconductor device, measuring noise leaking from a semiconductor device, evaluating a semiconductor device and such.

2. Description of the Related Art

Recently, as high-speed, high power consumption and highly integrated semiconductor devices are manufactured, demand for measuring high frequency noise outputted from the terminals of a semiconductor device rises. As an evaluation method for measuring high frequency noise and evaluating noise emission characteristics of a semiconductor device, there are proposed methods for operating a single semiconductor device and measuring noise thereof in IEC (International Electrotechnical Commission) as well as in US and European relevant industrial associations.

As a typical example of such evaluation methods, an evaluation method entitled "Electromagnetic Compatibility Measurement Procedures For Integrated Circuits-Integrated Circuit Radiated Emissions Measurement Procedure 150 kHz to 1000 MHz, TEM Cell" was made public in "IEC 47A/429/NP NEW WORK PROPOSAL, 1996.2". In addition, an evaluation method entitled "Electromagnetic Emission (EME) Measurement of Integrated Circuits, DC to 1 GHz" was made public in "IEC 47A/428/NP NEW WORK ITEM PROPOSAL, 1996.2". The former method is referred to as a first conventional method and the latter is referred to as a second conventional method, hereafter.

These evaluation methods are proposed specifications now under discussion in the IEC. In the methods, a semiconductor device is mounted on a test board, noise is measured and the noise emission characteristics of the semiconductor device is, thereby, inspected. The first conventional method is a typical example of measuring an electromagnetic field around the semiconductor device, whereas the second conventional method is a typical example of measuring noise leaking from the respective terminals of the semiconductor device.

Next, description will be given to the first conventional method. FIG. 1 is a typical view showing the structure of an evaluation apparatus for use in the first conventional method. FIG. 2 is a typical plan view showing a print-circuit board shown in FIG. 1.

As shown in FIG. 2, a semiconductor device 1401 which serves as a DUT (Device Under Test) of an evaluation target, is mounted on the surface of a print-circuit board 1303, which is referred to as a 'test board'. A peripheral circuit (not shown) for operating the semiconductor device is formed on the back surface of the print-circuit board 1303. A wiring pattern 1402 is formed at the surface of the print-circuit board 1303. Each terminal 1404 of the semiconductor device 1401 is connected to the wiring pattern 1402. The other end of the wiring pattern 1402 is connected to a via hole 1403 provided in the print-circuit board 1303.

An opening portion is provided on the upper portion of a measuring unit 1301, which is referred to as 'TEM Cell' (Transverse Electromagnetic Cell). As shown in FIG. 1, the print-circuit board 1303 is mounted in the opening portion. At this moment, the surface of the print-circuit board 1303, on which the semiconductor device 1401 is mounted, is directed toward the measuring unit 1301. One of the terminals of the measuring unit 1301 is terminated in a non-reflection manner by a terminating unit 1302. A spectrum analyzer 1305 is connected to the other terminal of the measuring unit 1301 through a preamplifier 1304. Then, while the influence of the peripheral circuit is being removed, the noise emitted from only the semiconductor device 1401 is measured as an electric field intensity by the spectrum analyzer 1305.

There are proposed other evaluation methods for measuring emitted noise in the vicinity of the semiconductor device 1401, as a DUT, as described above. Those methods are intended to measure the electromagnetic fields compounded in the vicinity of the semiconductor device as the intensity of the electromagnetic field and inspect the emission capability of the overall semiconductor device as in the case of the above-stated method using the measuring unit referred to as 'TEM Cell'.

Next, description will be given to the second conventional method. FIG. 3 is a typical view showing an evaluation apparatus for use in the second conventional method. FIG. 4 is a typical cross-sectional view showing a POGO pin used in the second conventional method.

As shown, a semiconductor device 1501, which serves as a DUT, is mounted on the surface of an IC test board 1505 consisting of a print-circuit board. A peripheral circuit (not shown) for operating the semiconductor device 1501 is formed on the back surface of the IC test board 1505. The IC test board 1505 is attached to a main test board 1507.

Micro-strip lines 1502 and 1504 are formed on the IC test board 1505 and the main test board 1507, respectively. The micro-strip lines 1502 and 1504 are connected to each other through an impedance matching circuit 1503. A receiver (electromagnetic measuring unit) 1508 is connected to the other end of the micro-strip line 1504. An EMI (electromagnetic interference) receiver or a spectrum analyzer is utilized as the receiver 1508. The receiver 1508 normally measures voltage generated by a load of 50 Ω. Both of the test boards 1505 and 1507 are disc shaped and the micro-strip lines 1502 and 1504 radially extend from the centers of the test boards 1505 and 1507, respectively.

Normally, the IC test board 1505 and the main test board 1507 are connected by means of a sliding component referred to as POGO pin shown FIG. 4. The POGO pin is formed such that a pin contact 1602 can be slid in a socket 1601 by a spring 1603, a plate spring 1604 and such.

Conductive noise generated at the respective pins of the semiconductor device 1501, as a DUT, is measured by way of the micro-strip lines 1502 and 1504.

However, the first conventional method has disadvantage in that emitted noises from the overall print-circuit board 1303 as a test board, the wiring pattern 1402, the via hole 1403 and the terminal 1404 of the semiconductor device 1401, as a DUT, cannot be distinguished from one another.

There are some cases where the emission of electromagnetic waves resulting from the overall structure of the print-circuit board 1303 as a test board is observed. Electromagnetic waves emitted from all of these emission elements are compounded and observed as emitted noise. This makes it extremely difficult to find one of many terminals 1404 provided at the semiconductor device that emits significant noise.

In addition, the first conventional method has a disadvantage in that using the intensity of an emitted electric field as an indicator for EMI noise preventive measures is difficult. The reason is as follows. The emission capability of the semiconductor device depends on various conditions including outside dimensions and shapes of chips and lead frames on the semiconductor device, the number of pins and such. Due to the dependency, it is required to take those conditions into account when carrying out the method. However, in the TEM Cell method for measuring noise emitted from the overall semiconductor device, it is almost impossible to give consideration to the conditions of those emission elements. As a result, measurement results obtained differ in the types of the evaluation target semiconductor devices, thereby making it extremely difficult to relatively inspect them based on the measurement results.

Meanwhile, the second conventional method has a disadvantage in that it is required to conduct tests in a state under impedance conditions and such for the respective micro-strip lines, terminal conditions different from those of the ordinary operating state. The reason is as follows. In the second conventional method, conductive noises generated at the respective pins of the semiconductor device are measured. During the measurement, the noises pass through the respective micro-strip lines 1502 and 1504, the impedance matching circuit 1503 and such.

Furthermore, although the POGO pin is used as a contact, the high frequency characteristics thereof is bad. That is, when the frequency is several hundred MHz or more, the transmission characteristics of the POGO pin disadvantageously deteriorates. Besides, if power consumption becomes high, the POGO pin cannot be applied to the power source pin. Due to this, it is impossible to conduct tests in the ordinary operating state.

In addition, the second conventional method has a disadvantage in that only the voltages of the respective pins of the semiconductor device 1501 are measured. Normally, voltage largely depends on load conditions. For that reason, when the quantity of noise emitted from the print-circuit board and the cable connected to the semiconductor device is calculated, the second conventional method includes many factors which deteriorate the accuracy of estimating voltage. It is possible to relatively easily calculate the intensity of a distant, emitted electromagnetic field using a model such as a magnetic dipole moment if current is to be measured. In the IC test board method, however, current measurement accuracy is lowered.

FIG. 5 is a circuit diagram showing a conventional current detecting circuit used in the IC test board method. In the current detecting circuit used in the IC test board method, one of the two input terminals is grounded and the other thereof is connected to a first resistor 1701 and a second resistor 1703. The resistance value of the second resistor 1703 is 1Ω and the other end of the second resistor 1703 is grounded. The resistance value of the first resistor 1701 is 49 Ω and a coaxial line 1702 is connected to the other end of the first resistor 1701. The coaxial line 1702 has a resistance value of 50 Ω. Also, a decoupling capacitor 1705 is connected to the coaxial line 1702. One of the two output terminals is grounded and the other thereof is connected to the decoupling capacitor 1705.

As can be seen from the above, the conventional IC test board method employs a current detecting circuit (probe) converting input voltage to current at both ends of the second resistor 1703. Due to this, a signal passes through a type of the converting circuit, thereby deteriorating current measurement accuracy.

The problem with both the first and second conventional methods is that a measurement value largely depends on the constitution of the peripheral circuit and that of the power circuit. Normally, a peripheral circuit and a power circuit for driving a semiconductor device are provided on the back surface of the test board. Noise emitted from those circuits often adversely affect the measurement value. In addition, conditions for the connection of the semiconductor device with the peripheral circuit during tests differ from those of a case where the semiconductor device is actually used. In that case, the terminal conditions with respect to the semiconductor device are different from the conditions under which the semiconductor device is actually used. This results in the fluctuation of the measurement value to thereby cause an error in the value.

There is disclosed a magnetic field detector whose object is to be minimized (Japanese Patent Application Laid-open No. 11-72545). The magnetic field detector may be set close to a source of the magnetic field by the minimization, if there are plural sources, because influences of the other sources are reduced. The magnetic field detector disclosed in the publication has a multi-layer structure substrate, in which signal layer are sandwiched by two grand layers. A pattern which bends at two points are formed at the signal layer and a rectangular pattern which covers the pattern of the signal layer are formed at the grand layers. A crack is provided for one end of the pattern of the grand layers. The pattern of the signal layer is connected to the pattern of the grand layers at the position which the pattern of the signal layer passes the crack. The other end of the pattern of the signal layer is connected to the internal conductor of a coaxial line for signal output. The outer conductor of the coaxial line is connected to the pattern of the grand layers.

SUMMARY OF THE INVENTION

It is an object of the present invention to provide a semiconductor device evaluation apparatus capable of conducting an accurate EMI evaluation under the equal conditions to those under which the semiconductor device is actually used.

According to one aspect of the present invention, a semiconductor device evaluation apparatus includes a test board. The test board may include a print wiring provided at a first surface on which a semiconductor device is mounted, a terminal of the semiconductor device being connected to the print wiring. The test board may also include a power circuit provided at a second surface opposite to the first surface, being connected to the print wiring and actuating the semiconductor device. The semiconductor device evaluation apparatus may further include a magnetic field detector provided above the print wiring and a current detector. The magnetic field detector detects a magnetic field generated from the print wiring, and the current detector detects a value of current carried through the print wiring in association with a magnitude of the magnetic field detected by the magnetic field detector.

According to one aspect of the present invention, the current outputted from the semiconductor device is measured without contacting the magnetic field detector with the print wiring. This makes it possible to conduct an EMI evaluation of a semiconductor device in a state in which the semiconductor device is ordinarily used and to thereby conduct the EMI evaluation of the semiconductor device with higher accuracy.

In addition, the apparatus may further comprise a ground pattern which forms a micro-strip wiring together with the print wiring. In this case, it is possible to set the transmission impedance of the print wiring at a desired value and, therefore, to make a standardized measurement.

Further, the apparatus may further comprise a decoupling circuit, which suppresses high frequency current transmitted from a terminal of the semiconductor device, connected between the print wiring and the power circuit. In this case, it is possible to terminate the print wiring in a state close to non-reflection and, therefore, to suppress the fluctuation of a measurement value.

Moreover, the test board may include at least two conductor layers provided inside thereof and having a substantially equal area to an area of the test board. In this case, it is possible to suppress high frequency noise generated from the power circuit provided on one surface of the test board from entering the print wiring provided on the opposite surface of the test board through the interior of the test board.

Also, the apparatus may further include a shielding member which shields electromagnetic noise emitted from the power circuit. In this case, it is possible to suppress high frequency noise generated from the power circuit from entering the print wiring provided on the opposite surface thereof through the side surface of the test board.

Furthermore, a shape of a portion of the magnetic field detector facing the print wiring may be substantially linear. In this case, it is possible to make the magnetic field detector closer to the print wiring. Thus, the magnetic field detector is less susceptible to the influence of ambient noise and the magnetic field generated from the print wiring can be measured accurately.

Moreover, the magnetic field detector may include a plurality of stacked conductor layers. In this case, it is possible to detect only a magnetic field while shielding an electric field.

DESCRIPTION OF THE PREFERRED EMBODIMENTS

Hereinafter, a semiconductor device evaluation apparatus in one embodiment according to the present invention will be described in detail with reference to the accompanying drawings.

Figure 1:
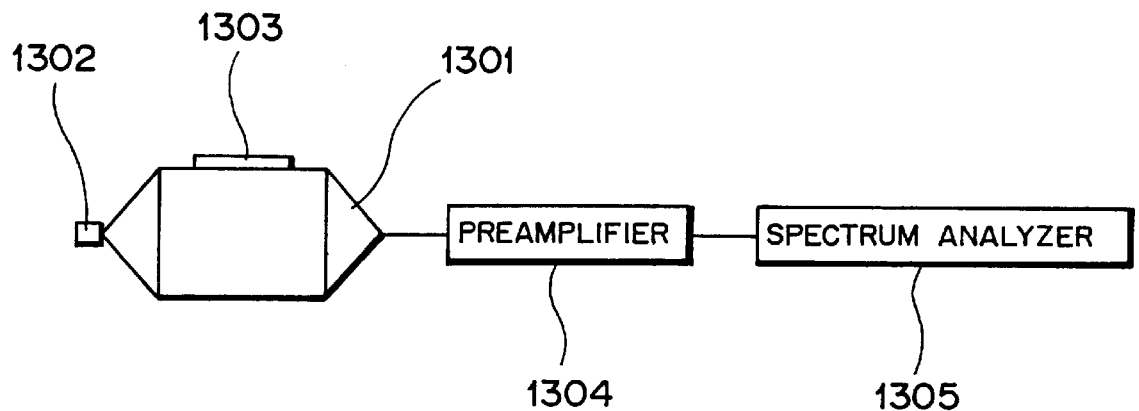
FIG. 1 is a typical view showing the structure of a first conventional evaluation apparatus.
Figure 2:
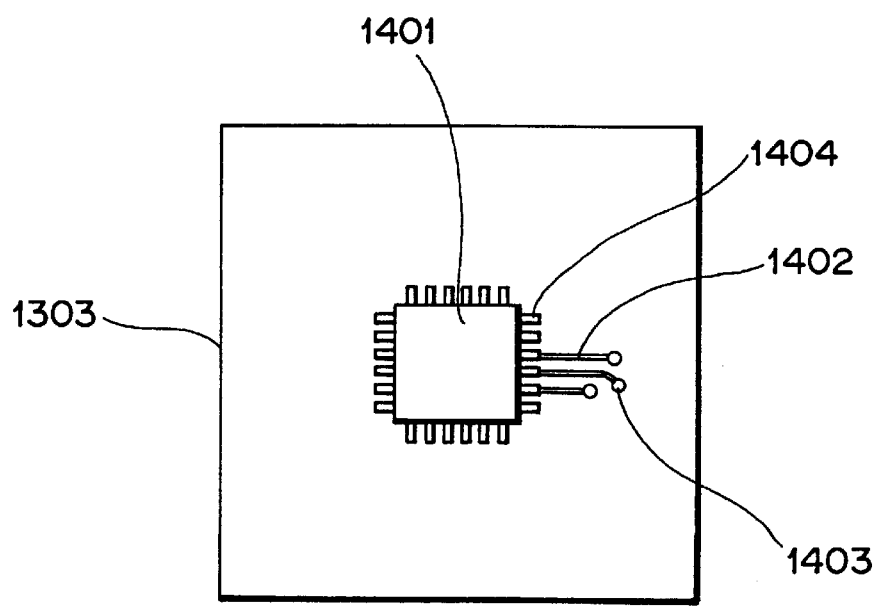
FIG. 2 is a typical plan view showing a print-circuit board shown in FIG. 1.
Figure 3:
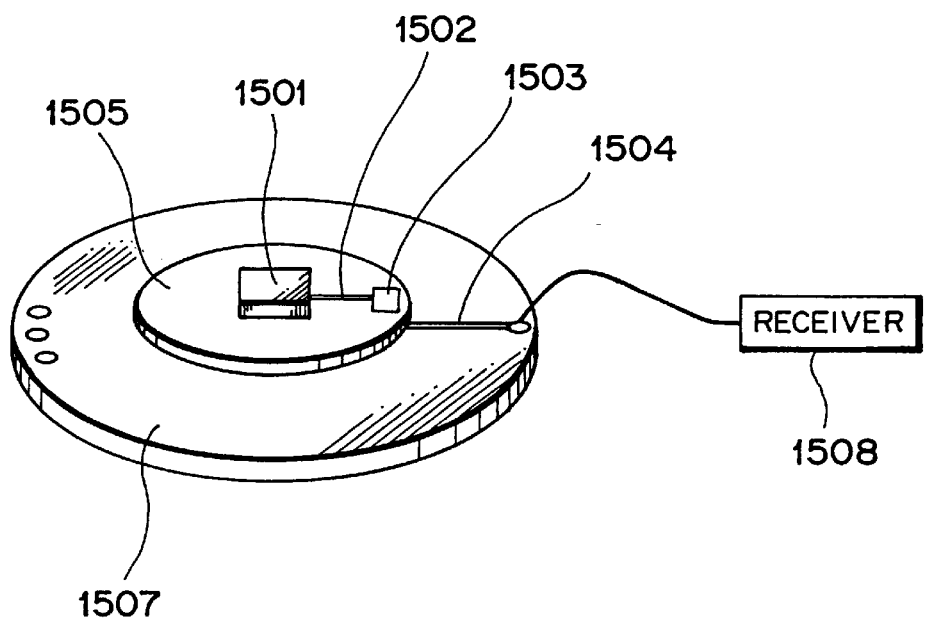
FIG. 3 is a typical view showing the structure of a second conventional evaluation apparatus.
Figure 4:
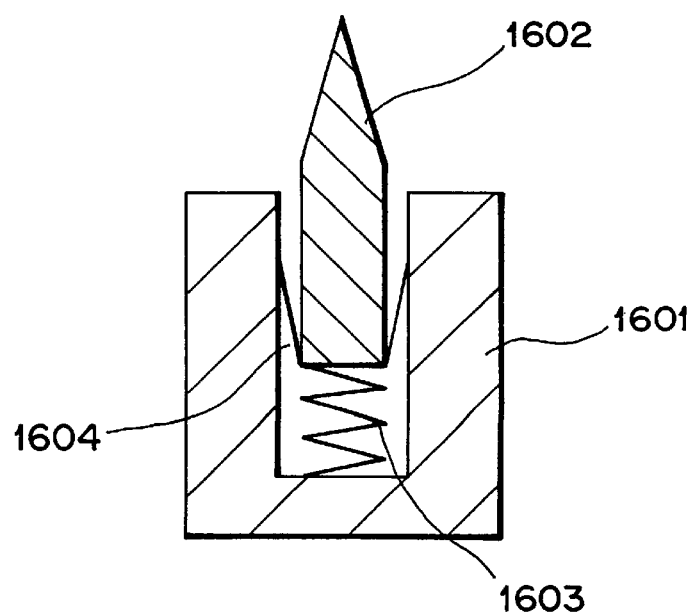
FIG. 4 is a typical cross-sectional view showing a POGO pin used in the second conventional apparatus.
Figure 5:
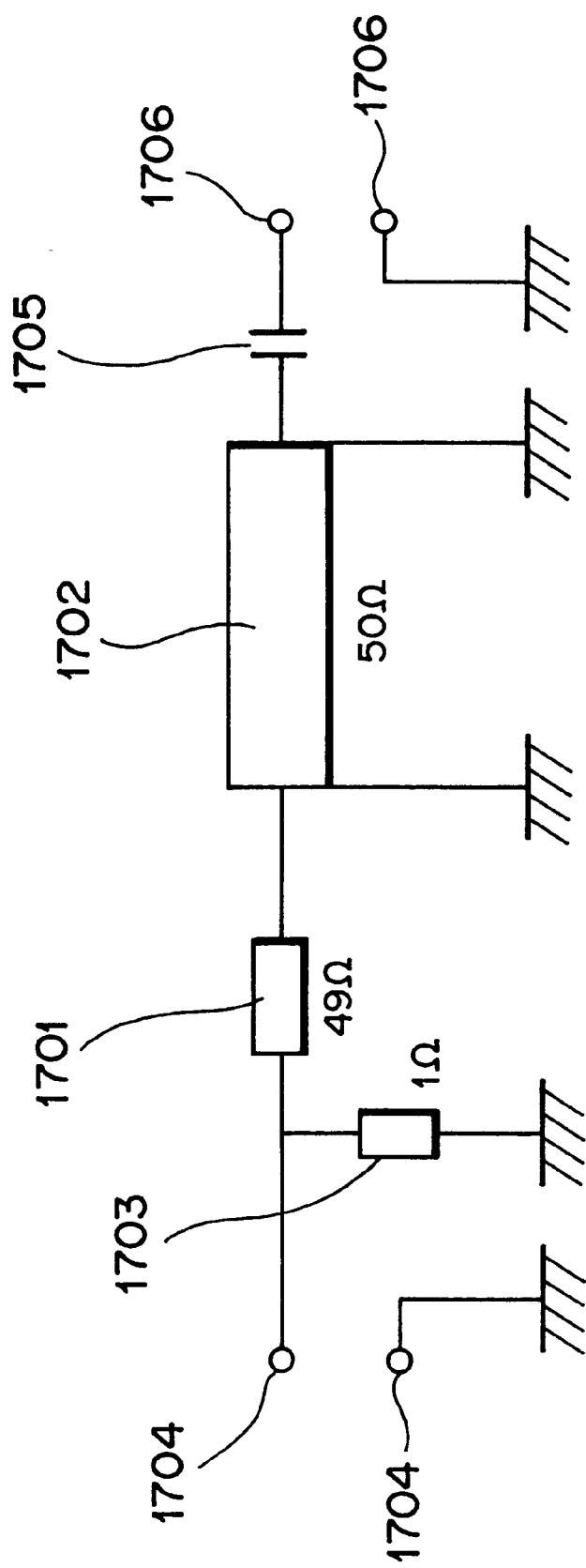
FIG. 5 is a circuit diagram showing a conventional current detecting circuit used in an IC test board method.
Figure 6:
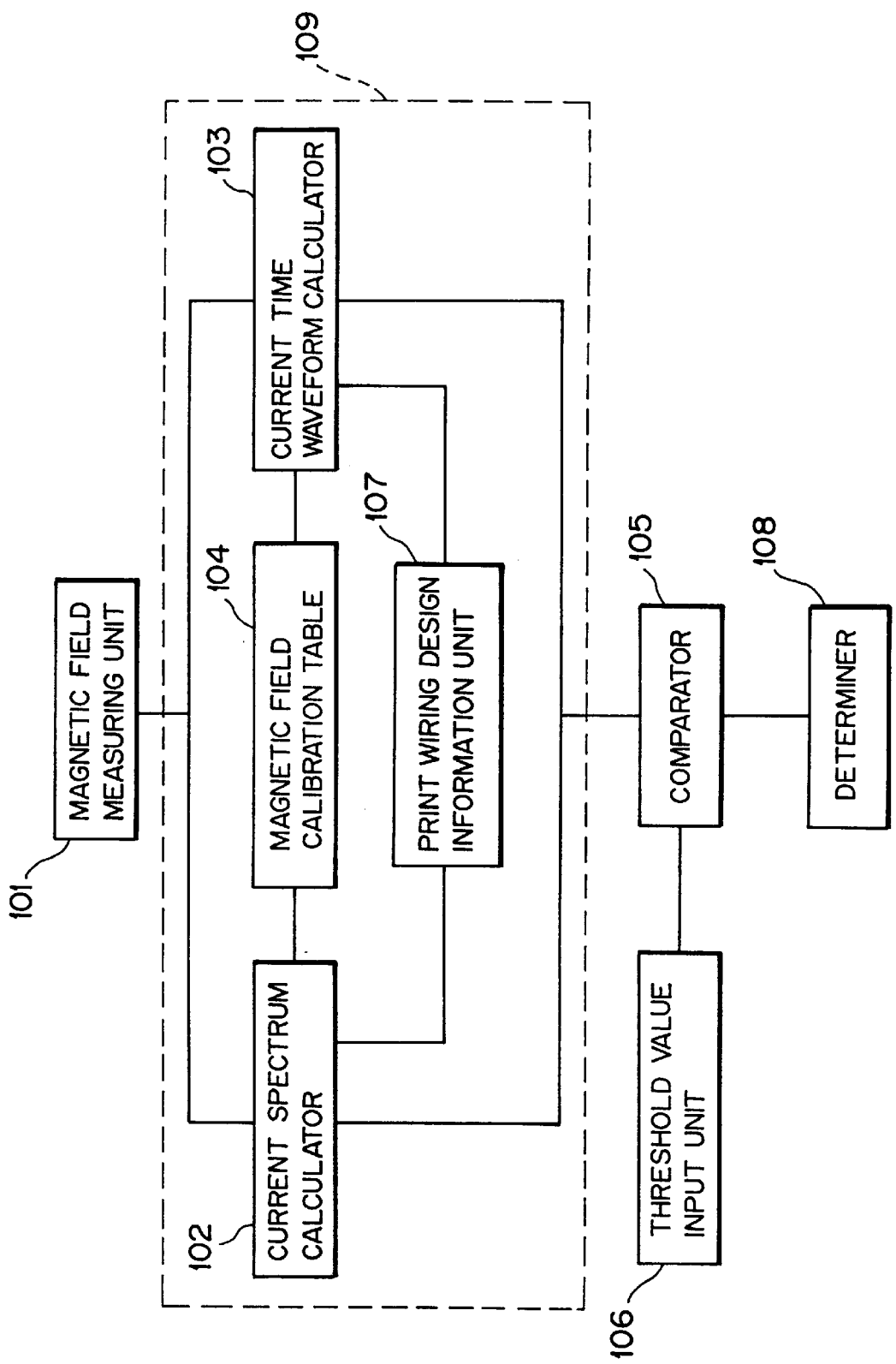
FIG. 6 is a block diagram showing a semiconductor device evaluation apparatus in one embodiment according to the present invention.

FIG. 6 is a block diagram showing a semiconductor device evaluation apparatus in one embodiment according to the present invention. The semiconductor device evaluation apparatus in this embodiment is provided with a magnetic field measuring unit 101 measuring a magnetic field generated from a measurement target. Voltage associated with the measured magnetic field is outputted from the magnetic field measuring unit 101. Also, there is provided a magnetic field calibration table 104 in which a conversion table indicating the relationship between the voltage outputted from the magnetic field measuring unit 101 and the intensity of a magnetic field. Further, there is provided a print wiring design information unit 107 in which information about the design of a print-circuit such as parameters indicating the structure of a print wiring, and the positional relationship between the magnetic field measuring unit 101 and the print wiring.

In addition, the semiconductor device evaluation apparatus is provided with a current spectrum calculator 102 converting the measurement voltage outputted from the magnetic field measuring unit 101 to the intensity of the magnetic field in association with the information stored in the magnetic field calibration table 104 and the print wiring design information unit 107. Further, the apparatus includes a current time waveform calculator 103 obtaining the time waveform of a current from the waveform of the measurement voltage in association with information stored in the magnetic field calibration table 104 and the print wiring design information unit 107. A current detector 109 obtaining a current value carried through the print wiring based on the magnitude of the magnetic field detected by the magnetic field measuring unit 101 includes the current spectrum calculator 102, the current time waveform calculator 103, the magnetic field calibration table 104 and the print wiring information unit 107.

Further, the semiconductor device evaluation apparatus is provided with a threshold value input unit 106 inputting a threshold value for the current spectrum and that for the current time waveform. Also, there is provided a comparator 105 for comparing the threshold value for the current spectrum and that for the current time waveform inputted to the threshold value input unit 106 with the current spectrum outputted from the current time waveform calculator 103 and the current time waveform outputted from the current time waveform calculator 103, respectively. In addition, there is provided a determiner 108 for determining the acceptance/rejection of a semiconductor device as a DUT, based on an output signal of the comparator 105.

Figure 7:
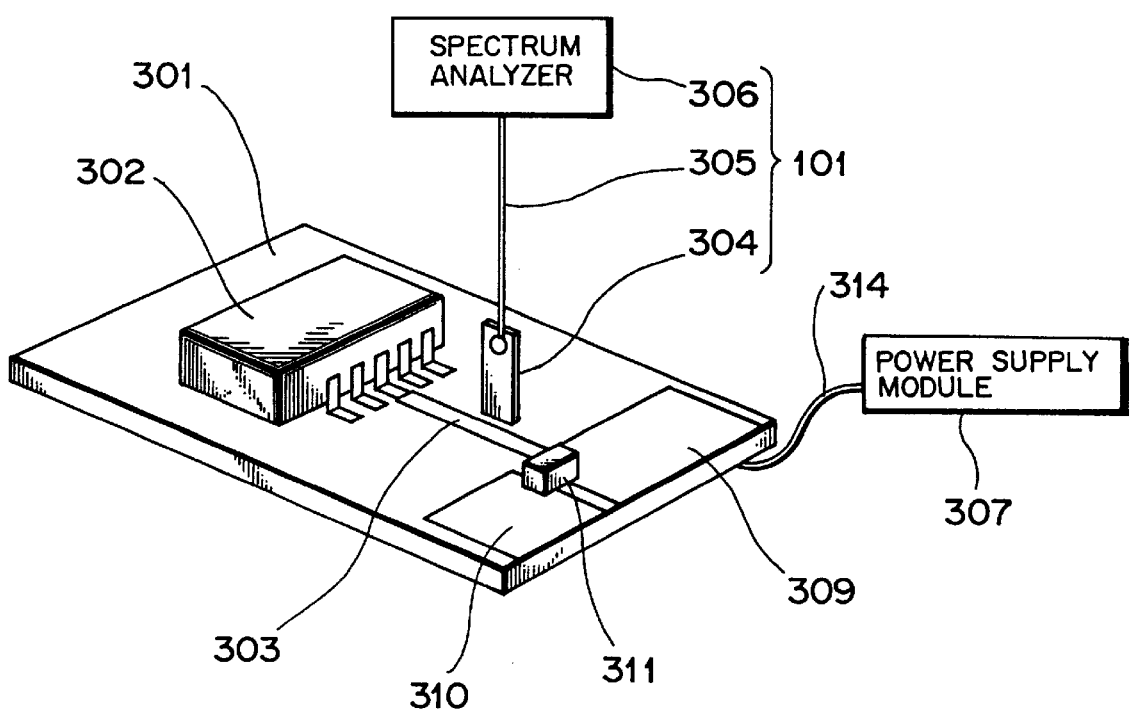
FIG. 7 is a typical view showing a method for installing the evaluation apparatus in this embodiment.

Next, a method for installing the semiconductor device evaluation apparatus according to this embodiment will be described. FIG. 7 is a typical view showing a method of installing the evaluation apparatus according to this embodiment. FIG. 8A is a typical plan view showing the structure of a test board and FIG. 8B is a typical cross-sectional view showing the structure of the test board.

As shown in FIG. 7, the magnetic field measuring unit 101 is provided with a magnetic field probe 304 for detecting a magnetic field generated from a measurement target and a spectrum analyzer 306 for measuring the intensity of the magnetic field generated from the measurement target based on the detection result of the magnetic field probe 304. The magnetic field probe 304 and the spectrum analyzer 306 are connected to each other with a coaxial cable 305.

Figure 8B:
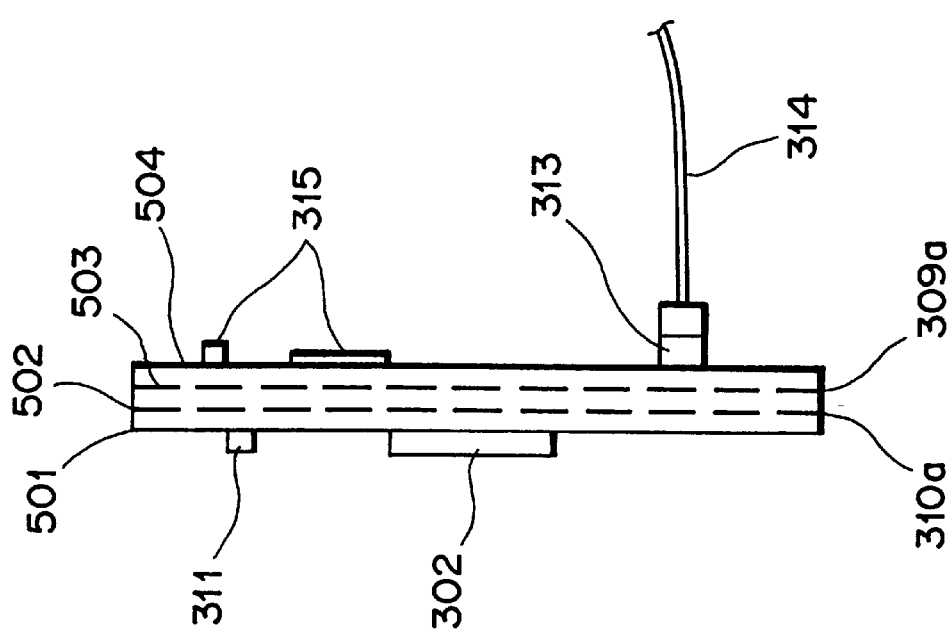
FIG. 8B is a typical cross-sectional view showing the structure of the test board.
Figure 8A:
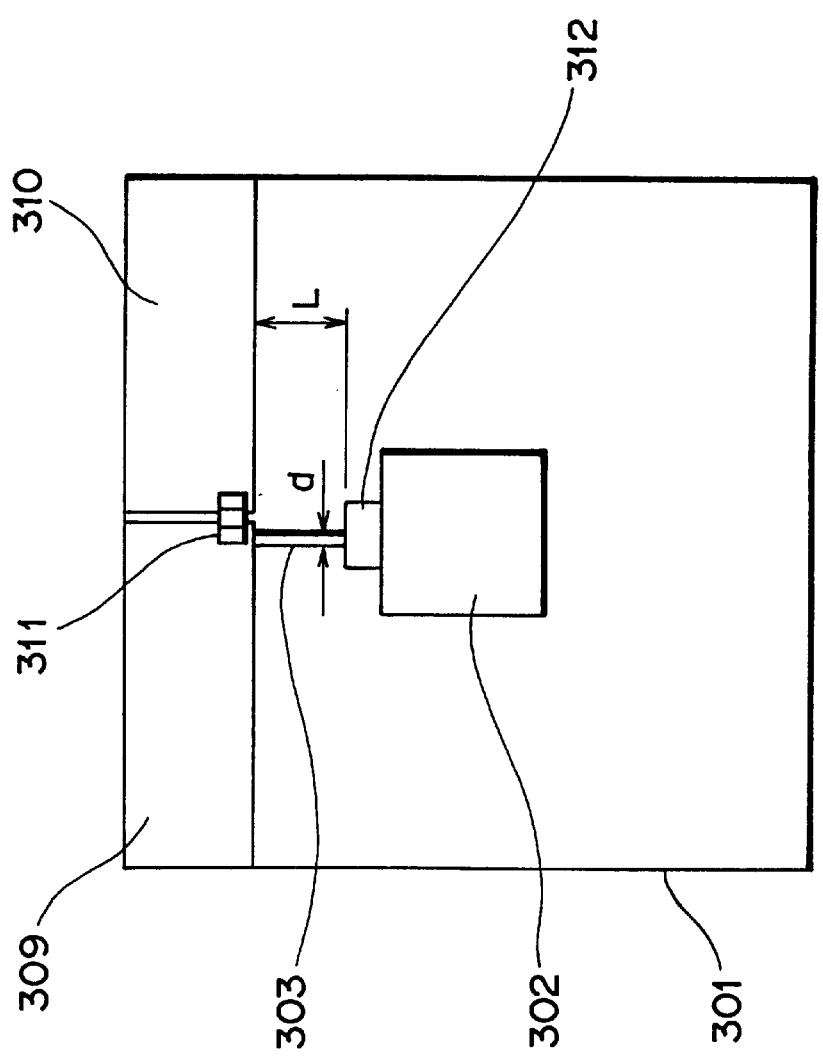
FIG. 8A is a typical plan view showing the structure of a test board.

As shown in FIGS. 7, 8A and 8B, a semiconductor device 302, which is a device under test (DUT), is mounted on a test board 301. A print wiring 303 is formed at the surface of the test board 301 and respective terminals of the semiconductor device 302 are connected to one end of the print wiring 303. A ground pattern 310 and a power pattern 309 are formed at an outermost layer 501 of the test board 301. The print wiring 303 is also included in the outermost layer 501 and the other end portion of the print wiring 303 is connected to the power pattern 309. The print wiring 303 is used as a power supply pattern.

A ground pattern 310a is provided in a second layer 502 of the test board 301. The ground pattern 310a is connected to the ground pattern 310 through a via hole (not shown). These ground patterns are grounded. In addition, a power pattern 309a is provided in a third layer 503 of the test board 301. The power pattern 309a is connected to the power pattern 309 through a via hole (not shown).

In this way, the print wiring 303 and the ground pattern 310a of the second layer 502 form a micro-strip wiring. Further, the ground pattern 310a of the second layer 502 functions as a electromagnetic shield. A capacitor 311 is connected between the power pattern 309 and the ground pattern 310, thereby forming a simplest decoupling circuit.

A fourth layer 504 is formed on the surface of the test board 301 opposite to the surface on which the semiconductor device 302 is mounted. As shown in FIG. 7, a power module 307 is connected to the fourth layer 504 through a power supply cable 314 and a connector 313. A peripheral circuit and a power circuit (not shown) connected to the print wiring 303 through a via hole (not shown) are provided in the fourth layer 504. Peripheral circuit components 315 are mounted on the peripheral circuit. The operation of the semiconductor device 302 is controlled by the peripheral circuit, the power circuit and the peripheral circuit components 315. The semiconductor device 302 and the peripheral circuit components 315 are actuated by the power supplied from the power module 307.

Moreover, the magnetic field probe 304 is arranged, for example, just on the print wiring 303. With the magnetic field probe 304, the magnetic field generated from the print wiring 303 is measured.

Figure 9:
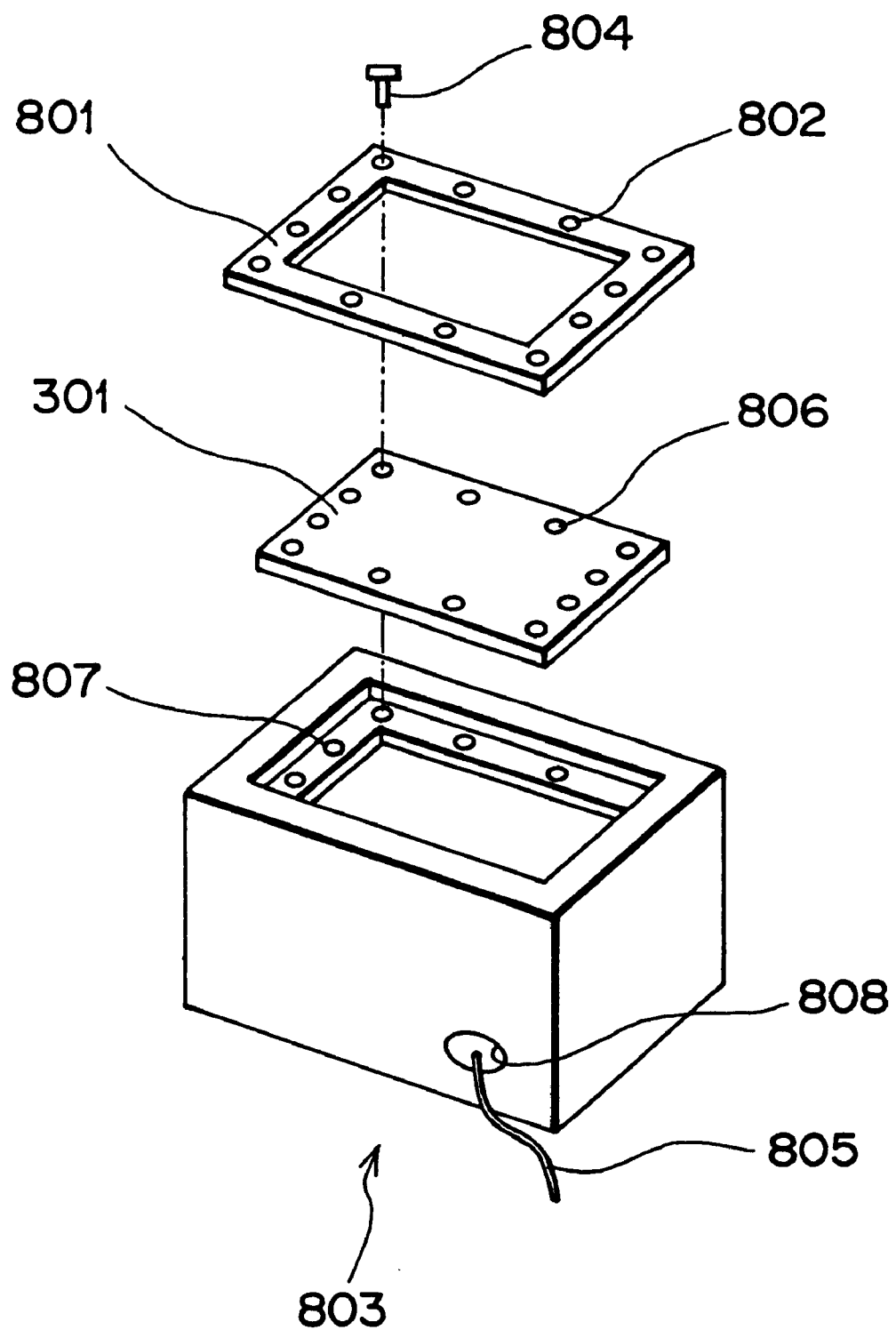
FIG. 9 is an exploded view showing a metal box in which the test board is enclosed.

FIG. 9 is an exploded view of a metal box in which a test board is enclosed. At the time of measuring a magnetic field, the test board 301 is enclosed in a metal box 803 as a shield member. At this time, the test board 301 is fixed to the housing of the metal box 803 by screws 804. A metal plate 801 is provided as a cover on the metal box 803 so as to ensure full shielding. Screw holes 802, 806 and 807 are provided in the metal plate 801, the test board 301 and the housing, respectively.

A step is formed in a portion of the housing of the metal box 803 to which the test board 301 is attached. With the provision of the step, it is possible to prevent the leakage of electromagnetic wave noise emitted outside from the side surface of the test board 301. The test board 301 is also shielded from noise entering from the surface side of the test board 301 by a magnetic plate 801 serving as a pressing plate, so that the test board 301 is shielded almost completely. An external connection cable 805 is drawn outside from a cable hole 808 provided at the lower portion of the housing of the metal box 803 and connected to a peripheral device (not shown) installed sufficiently away from the metal box 803.

Figure 10:
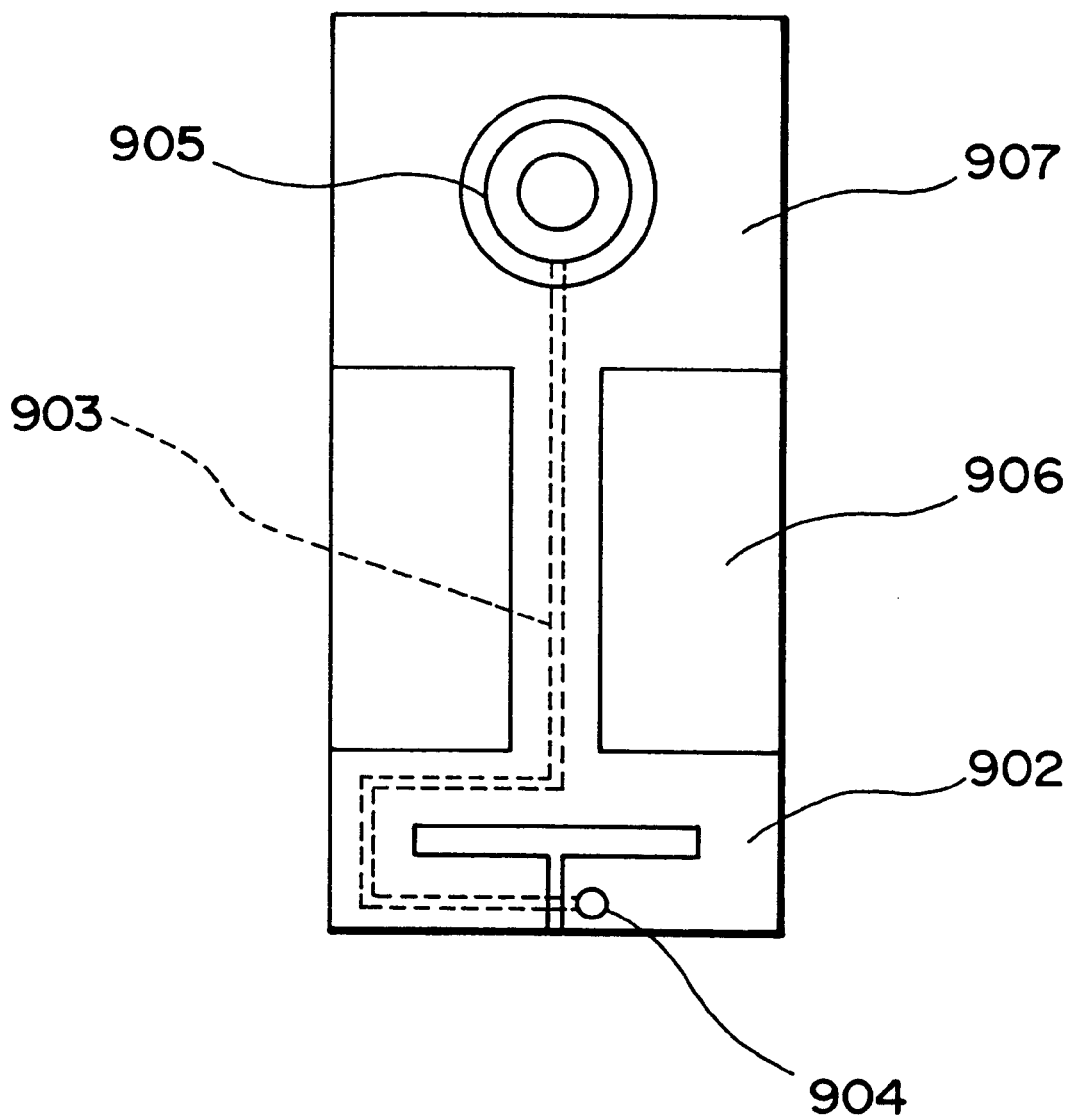
FIG. 10 is a plan view showing the structure of a magnetic field probe.

FIG. 10 is a plan view showing the structure of the magnetic field probe. The magnetic field probe 304 has, for instance, three-layer structure. A ground pattern 902 which is grounded and a pad 907 for connecting with a coaxial connector ground are provided in the first and the third layers. A signal layer having a conductive pattern 903 and a pad 905 for a coaxial connector central conductor are provided in the second layer. The conductive pattern 903 and the two ground patterns 902 are connected to one another through a via hole 904 at the tip end portion of the magnetic field probe 304. A dielectric layer is formed between the tip end portion and the coaxial connector pad. Although the magnetic field probe 304 is a loop type magnetic field detector, it has electric shielding characteristics of detecting only the magnetic field while shielding the electric field. The tip end portion of the magnetic field probe 304 is of linear shape so that it can approach the linear wiring pattern as closely as possible.

Figure 11A:
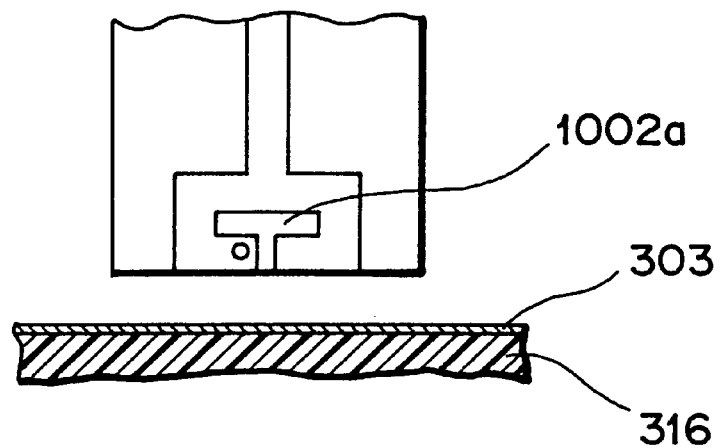
FIG. 11A is a typical view showing the magnetic field probe in the embodiment.
Figure 11B:
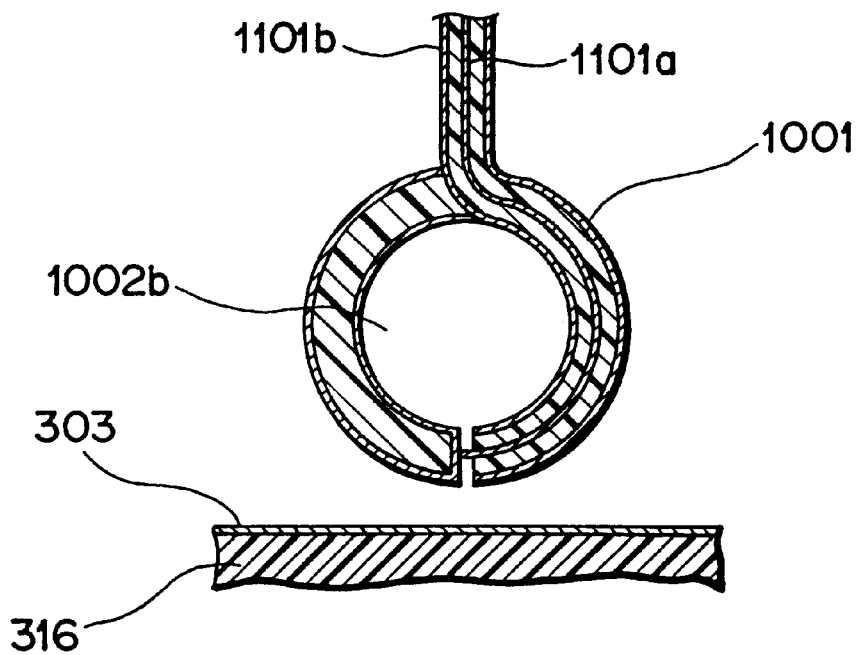
FIG. 11B is a typical view showing a conventional magnetic field probe.

FIG. 11A is a typical view showing the magnetic field probe in the embodiment according to the present invention. FIG. 11B is a typical view showing a conventional magnetic field probe. As described above, the tip end portion of the magnetic field probe 304 in this embodiment is of linear shape. On the other hand, the conventional, ordinary magnetic field probe 1001 consists of an annular coaxial connector including a central conductor 1001a and a ground conductor 1001b. Therefore, compared with a conventional magnetic field detecting portion 1002b, a magnetic field detecting portion 1002a in this embodiment is close to the print wiring 303 on the average. Therefore, in this embodiment, the magnetic field measuring unit 101 is less susceptible to the influence of surrounding noise than the conventional one.

Figure 12:
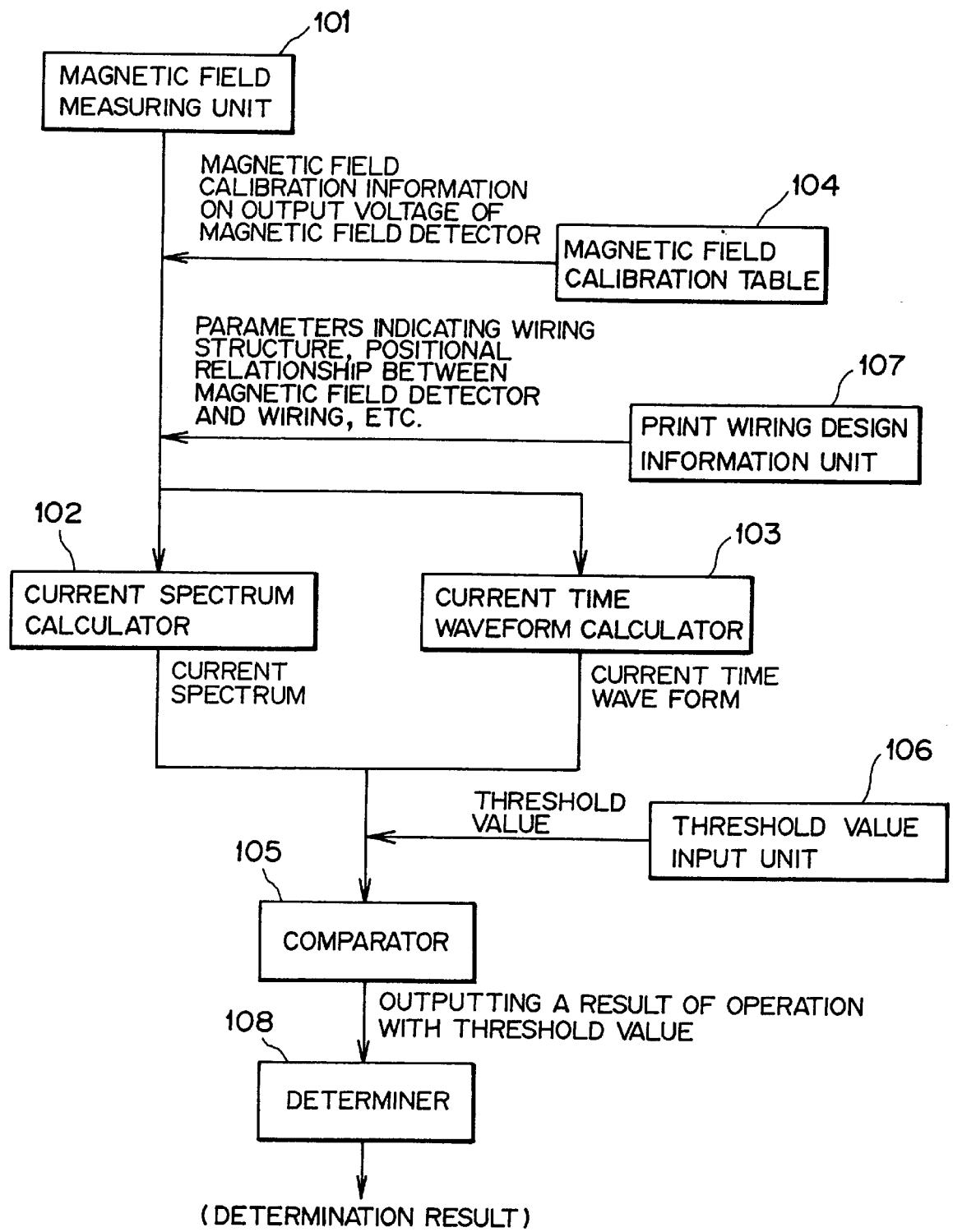
FIG. 12 is a flow chart showing the operation of the semiconductor device evaluation apparatus in the embodiment.

Next, an evaluation method using the semiconductor device evaluation apparatus having the structure described above will be described. FIG. 12 is a flow chart showing the operation of the semiconductor device evaluation apparatus according to the present embodiment.

A magnetic field generated from the print wiring 303 as a measurement target is measured by the magnetic field measuring unit 101. The measurement result is outputted as voltage from the magnetic field measuring unit 101. Next, using a magnetic field calibration table 104, in which a conversion table indicating the relationship between the intensity of a magnetic field and a voltage, the output voltage is converted to the magnetic field intensity and a current waveform.

Figure 13:
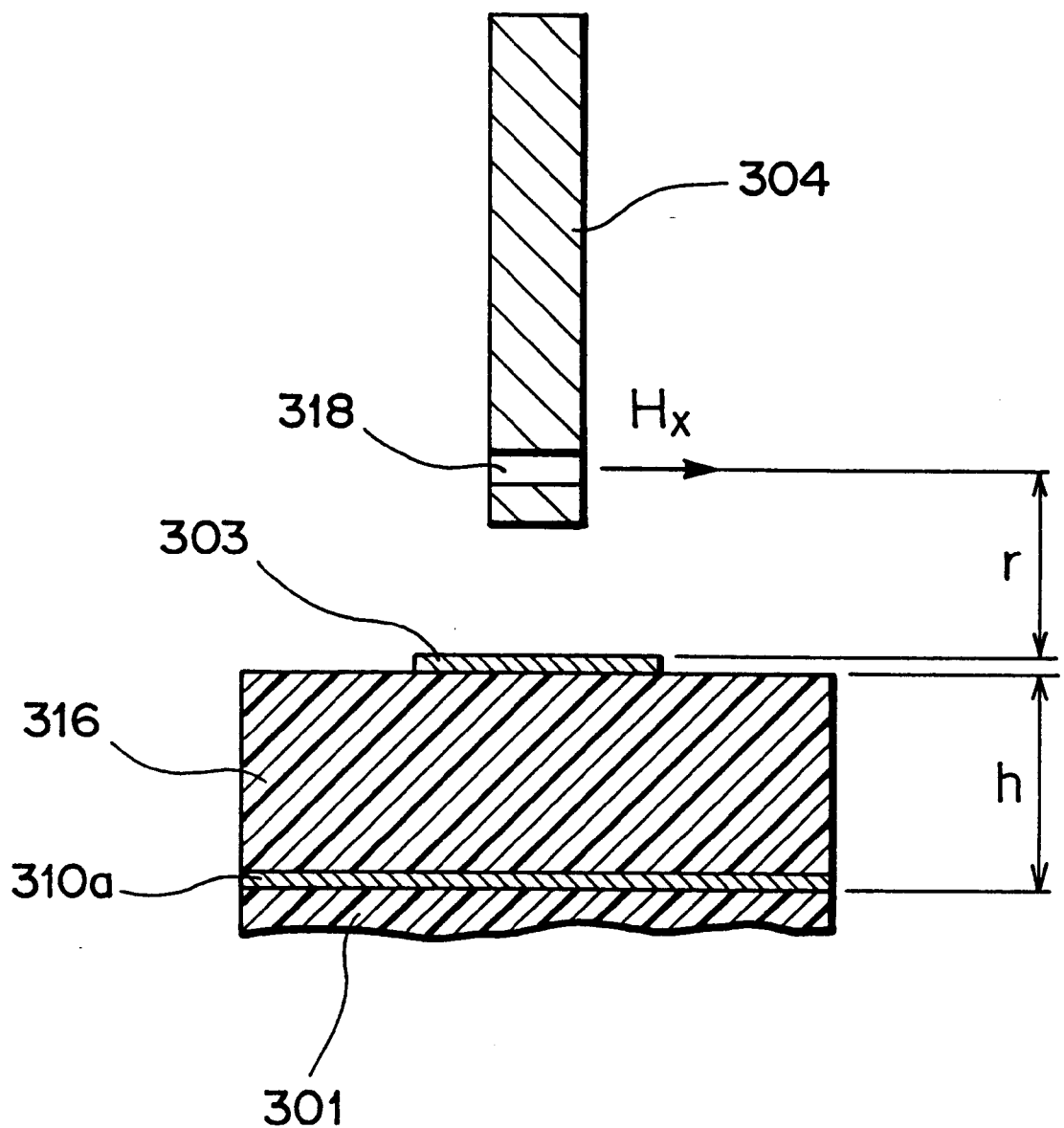
FIG. 13 is a typical view showing the magnetic field probe.

A method for converting the output voltage of the magnetic field measuring unit 101 to the magnetic field intensity will be described. FIG. 13 is a typical view showing a magnetic probe. When the magnetic field probe 304 is a loop probe as shown in FIG. 13, the relationship between a magnetic field H in the loop surface and the output voltage V of the magnetic field probe 304 is expressed by the following mathematical expression 1.

$$V = -\mu S \, (dH/dt) \quad (1)$$

where $\mu$ is the permeability of an ambient medium and S is a area of the loop. The voltage V and the magnetic field H are a complex voltage and a complex magnetic field, respectively.

A complex calibration factor F for converting the output voltage V to the magnetic field H is defined as shown in the following mathematical expression 2:

$$F = H/V \quad (2)$$

Figure 14:
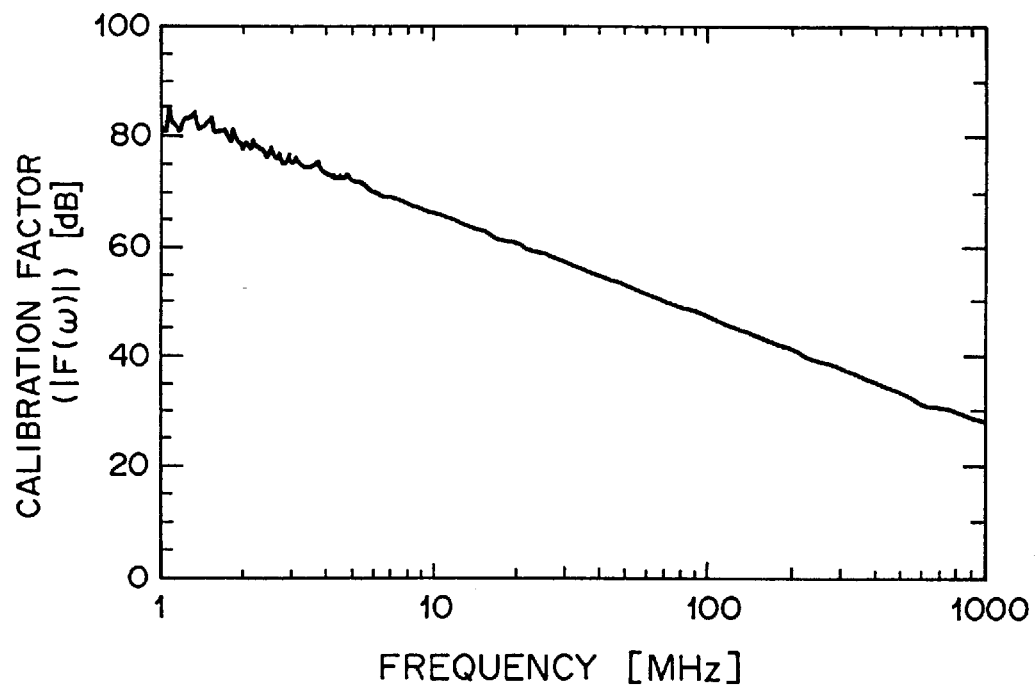
FIG. 14 is a graph showing the relationship between a frequency and an absolute value of a calibration factor.

FIG. 14 is a graph showing the relationship between a frequency and the absolute value of a calibration factor with the horizontal axis indicating the frequency and the vertical axis indicating the absolute value of a calibration factor. As shown in FIG. 7, it is possible to measure a voltage spectrum by using a spectrum analyzer as an electromagnetic measuring unit 306. A calibration table corresponding to the graph shown in FIG. 14 is stored in the magnetic field calibration table 104.

The calibration factor of the frequency corresponding to the measured frequency is obtained and the resultant calibration factor is multiplied by an output voltage, thereby calculating a magnetic field H. These steps are executed by the current spectrum calculator 102.

Figure 15:
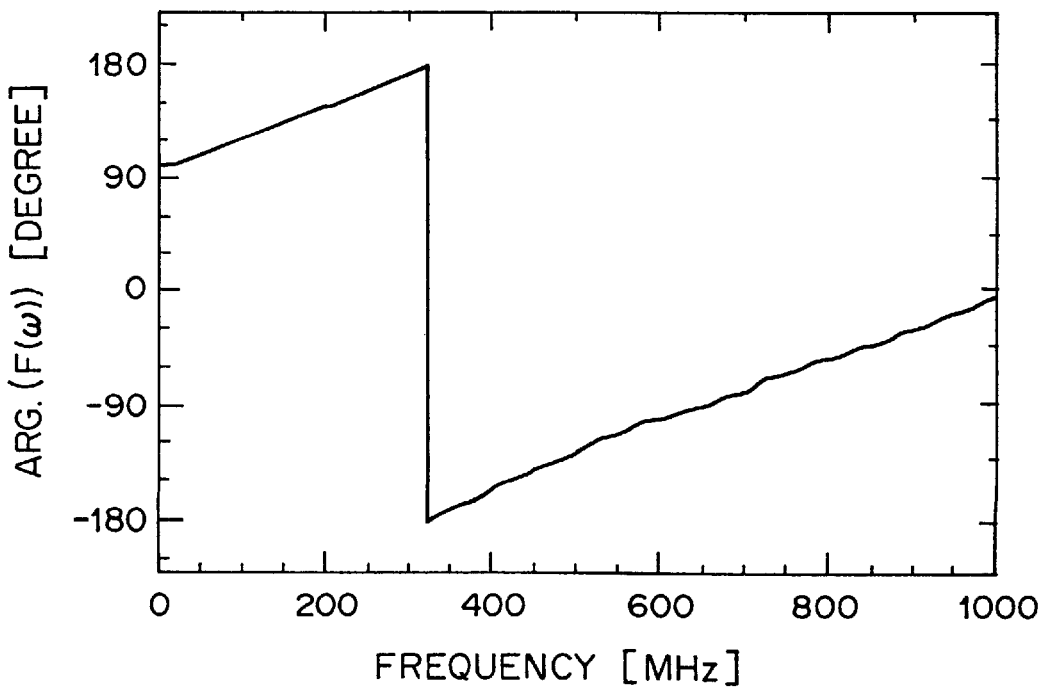
FIG. 15 is a graph showing the relationship between a frequency and a phase correction value.

In addition, a voltage waveform is obtained by such as an oscilloscope and a phase is corrected as shown in FIG. 15. Then, the current time waveform can be obtained from the output voltage from the magnetic field measuring unit 101. These steps are executed by the current time waveform calculator 103.

Next, a step of obtaining a complex current I from the magnetic field H obtained by the above-stated steps will be described. If the magnetic field H of a current carried through an infinite length linear conductor is expressed as "F V" based on the mathematical expression 2, the relationship as shown in the following mathematical expression 3 is obtained:

$$I = 2\pi r \, F \, V \quad (3)$$

where r is the shortest distance from the center of a loop opening portion 318 of the magnetic field probe 304 to the center of the print wiring 303.

The current I can be obtained from the output voltage V of the magnetic field probe 304 with the mathematical expression 3. Also, when the micro-strip line structure is formed by the print wiring 303 and the ground plane 310a of the second layer 502 as in this embodiment, it is necessary to consider a reflected image current which is assumed with the ground pattern set as a symmetrical plane. In this case, a complex reflected image current I' is expressed by the following mathematical expression 4:

$$I' = (\pi r/h)(r + 2h) \, F \, V \quad (4)$$

where h is the thickness of a dielectric 316 of the micro-strip line. At this time, information about the design of the micro-strip line on the test board 301 is required. Since the information is stored in a print wiring design information unit 107, it is obtained from the unit 107.

Thereafter, the current spectrum outputted from the current spectrum calculator 102 and the current time waveform outputted from the current time waveform calculator 103 are inputted to the comparator 105. The magnitude of the above-stated current spectrum and the current time waveform is compared with the magnitude of a predetermined threshold value (limit value) inputted from the threshold value input unit 106 by the comparator 105. A spectrum or a current time waveform having a value equal to or higher than the threshold value is outputted from the comparator 105 and inputted to the determiner 108.

Whether the magnitude of the current carried through the print wiring 303 falls within the range of a predetermined allowable specification is determined based on the frequency of the spectrum and the difference from the threshold value by the determiner 108. If the magnitude does not fall within the allowable range, it is determined that the measured semiconductor device is a rejected device.

The magnetic field measuring unit 101 will be described in more detail.

As shown in FIG. 7, the magnetic field measuring unit 101 is installed such that the magnetic field probe 304 is put perpendicularly to the linear print wiring 303 on the test board 301. When the magnetic field probe 304 and the print wiring 303 are set with a above-described relationship, the line of magnetic force of the magnetic field generated from the print wiring 303 directly passes the loop opening portion 318 of the magnetic field probe 304. Therefore, the magnetic field generated from the print wiring 303 is efficiently detected.

The reason for forming the print wiring 303 at the outermost surface 501 of the test board 301 is to efficiently detect the magnetic field by means of the magnetic field probe 304 without the influence of ambient noise. Moreover, the print wiring 303 is formed linearly, which is thus optimized to efficiently detect the magnetic field.

The width d of the print wiring shown in FIG. 8A is about 1 mm in this embodiment. The width d is set in view of the thickness of the magnetic field probe 304.

It should be noted that since the magnetic field probe 304 does not contact with the print wiring 303, the influence of the probe 304 on the operation of the semiconductor device, which is an evaluation target, is prevented and no significant influence is given to a measurement value.

When the print wiring 303 on the test board 301 is of a micro-strip wiring structure having a resistance value of, such as, 50 Ω, 75 Ω or 150 Ω, a standardized measurement can be made. By setting the resistance value of the print wiring 303 on the test board 301 at 50 Ω, 75 Ωor 150 Ω, therefore, it is possible to prevent reflection generated at the connection portion with the measuring unit or the semiconductor device. It is known that the input impedance of most measuring units is about 50 Ω and that of most semiconductor devices is about 150 Ω. Also, it is possible to suppress the reflection in a high frequency band and prevent the occurrence of noise by matching the impedance of the print wiring 303 to the internal impedance of the semiconductor device 302, which is a measurement target, or a power supply module 307. Thus, the present embodiment ensures the large degree of freedom for setting measurement conditions in a high frequency band.

In addition, there is a possibility that the measurement value is varied by the internal impedance of the power supply module 307 due to the fact that one end of the print wiring 303 is connected to the power pattern 309. In this embodiment, the capacitor 311 is connected between the power pattern 309 and the ground pattern 310, so that the influence of the power supply module 307 is suppressed to a minimum.

Figure 16:
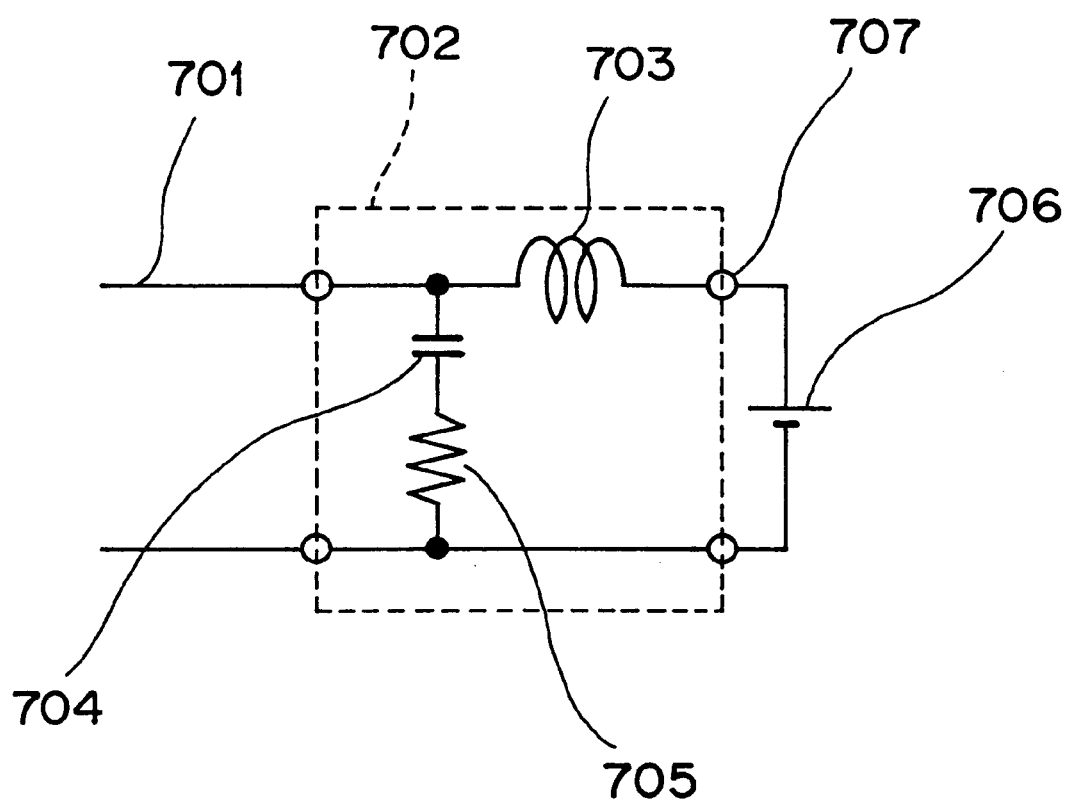
FIG. 16 is a circuit diagram showing an example of decoupling circuit.

It should be noted that a decoupling circuit should not be limited to a capacitor. FIG. 16 is a circuit diagram showing an example of a decoupling circuit. A decoupling circuit 702 may include a capacitor 704 and a resistor 705 connected in series to each other on wirings 701. In addition, the inductor 703 is provided to be connected to the wiring 701 at the capacitor 704 side. The transmission of high frequency noise can be prevented by the inductor 703. The adverse effect on a power source 706 is, therefore, prevented. The capacitance value of the capacitor 704 is selected based on the impedance of the wiring 701 and the band of the high frequency noise generated from the measurement target. By appropriately matching the impedance, the wiring 701 is terminated in a state close to non-reflection and the fluctuation of the measurement value is suppressed.

If the print wiring 303 is too long, the inductance of the print wiring 303 itself becomes too high in the high frequency band and undesired voltage fluctuation occurs. If the print wiring 303 is too short, by contrast, the sensitivity for magnetic field detection deteriorates. It is, therefore, preferable that the length of the print wiring 303 is about 10 mm with 1 MHz to 1 GHz in the ordinary measurement band.

The ground pattern 310a provided in the second layer 502 of the test board 301 so as for the pattern 310a and the print wiring 303 to form the micro-strip line, is preferably formed to spread on the entire layer of the second layer 502. That is, it is preferable that the area of the ground pattern 310a is substantially equal to that of the surface of the test board 301. In this connection, the power pattern 309a is preferably formed to spread on the entire surface of the third layer 503, as well.

When the ground pattern 310a and the power pattern 309a are formed to spread on the entire layer, the ground pattern 310a of the second layer 502 functions as an electromagnetic shield, to thereby suppress noise passed round from the peripheral circuit components 315 mounted on the back surface of the test board 301. When the test board is a single-layer structure, the voltage of the peripheral circuit components 315 occurs on the back of the ground pattern 310a which is the constituent of the micro-strip line and noise may possibly enter the micro-strip line.

Noise is mainly emitted from the peripheral circuit provided on the back surface of the test board 301, the power supply module 307 connected on the back surface of the test board 301 or the like. Due to this, it is preferable that the peripheral circuit and the power circuit provided on the back surface of the test board 301 are covered with the metal box 803 shown in FIG. 9 to shield the emitted noise. As described above, the leakage of the electromagnetic wave noise to and from the test board 301 is prevented by the metal box 803, whereby the test board 301 is shielded substantially completely. As a result, high accuracy detection is made possible.

Although the above embodiment concerns a semiconductor device evaluation apparatus for evaluating a power circuit, the present invention is also applicable to the evaluation of a signal circuit. In case of the evaluation of a signal circuit, a magnetic field is measured on a signal line (print wiring). In that case, pads and components for measurement are not inserted and it is, therefore, possible to measure the magnetic field without changing a state in which the measurement target is used. In this way, a high-speed, high-frequency semiconductor device due to improved processing capability can be evaluated while the semiconductor device is being maintained to the same state as a state in which the device is normally used.

Figure 17:
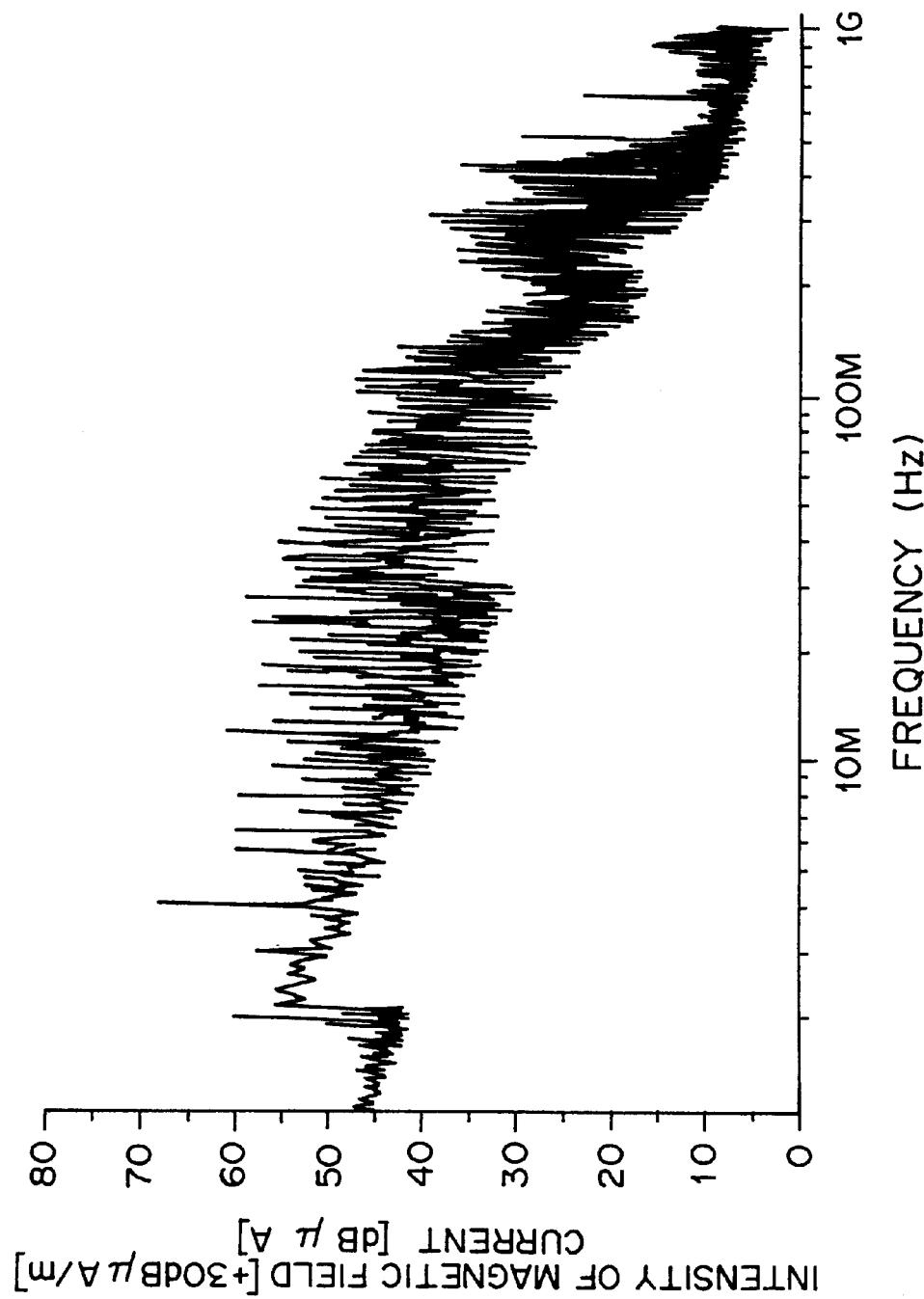
FIG. 17 is a graph showing the measurement result in this embodiment.
Figure 18:
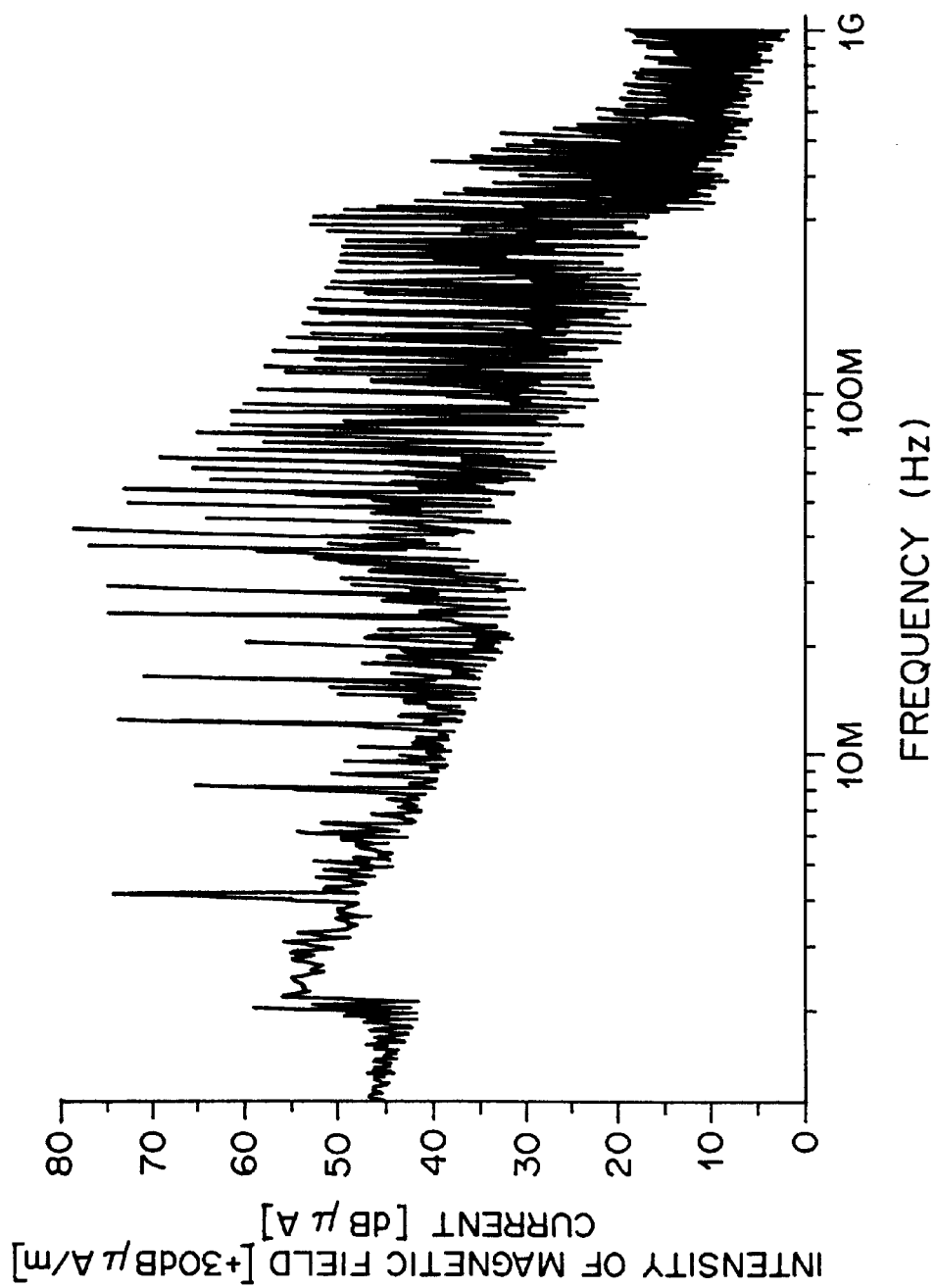
FIG. 18 is a graph showing the measurement result of the conventional evaluation apparatus.

FIG. 17 is a graph showing the measurement result of a current value on the wiring pattern for the power supply of the semiconductor device based on the magnetic field according to the above embodiment. FIG. 18 is a graph showing the measurement result of a current value on the wiring pattern for the power supply of the semiconductor device based on the magnetic field in the conventional evaluation apparatus. In the present embodiment, noise preventive countermeasures are taken for the power circuit of the test board as already stated above. Thus, as can be seen from FIGS. 17 and 18, the noise level in the present invention is lowered greatly compared with that in the conventional apparatus. Hence, according to the semiconductor device evaluation apparatus in the present embodiment, it is possible to inspect the effect of the preventive countermeasures quantitatively, which characteristics is quite useful for the evaluation of the design of a semiconductor device.

What is claimed is:

1. A semiconductor device evaluation apparatus comprising:
   a test board, said test board including:
      a print wiring provided at a first surface on which a semiconductor device is mounted, a terminal of said semiconductor device being connected to said print wiring; and
      a power circuit provided at a second surface opposite to said first surface, said power circuit being connected to said print wiring and actuating said semiconductor device;
   a magnetic field detector provided above said print wiring and detecting a magnetic field generated from said print wiring; and
   a current detector detecting a value of current carried through said print wiring based on a magnitude of said magnetic field detected by said magnetic field detector.

2. A semiconductor device evaluation apparatus according to claim 1, further comprising a ground pattern which forms a micro-strip wiring together with said print wiring.

3. A semiconductor device evaluation apparatus according to claim 2, wherein said micro-strip wiring has one transmission impedance selected from the group consisting of 50 Ω, 75 Ω and 150 Ω.

4. A semiconductor device evaluation apparatus according to claim 1, wherein an overall length of said print wiring is substantially 10 mm.

5. A semiconductor device evaluation apparatus according to claim 1, further comprising a decoupling circuit connected between said print wiring and said power circuit, said decoupling circuit suppressing high frequency current transmitted from a terminal of said semiconductor device.

6. A semiconductor device evaluation apparatus according to claim 5, wherein said decoupling circuit comprises:
   an inductor element connected between said print wiring and said power circuit; and
   a capacitor element and a resistor element connected in series to each other between said print wiring and a ground, said capacitor element and said resistor element connected to said first surface.

7. A semiconductor device evaluation apparatus according to claim 1, wherein said test board includes at least two conductor layers provided inside thereof and having a substantially equal area to an area of said test board.

8. A semiconductor device evaluation apparatus according to claim 1, further comprising a shielding member which shields electromagnetic noise emitted from said power circuit.

9. A semiconductor device evaluation apparatus according to claim 1, wherein a shape of a portion of said magnetic field detector facing said print wiring is substantially linear.

10. A semiconductor device evaluation apparatus according to claim 1, wherein said magnetic field detector includes a plurality of stacked conductor layers.

11. A semiconductor device evaluation apparatus comprising:

a test board, said test board including:
- a print wiring provided at a first surface on which a semiconductor device is mounted, a terminal of said semiconductor device being connected to said print wiring; and
- a power circuit provided at a second surface opposite to said first surface, said power circuit being connected to said print wiring and actuating said semiconductor device;

a magnetic field detector provided above said print wiring and detecting a magnetic field generated from said print wiring; and a current detector detecting a value of current carried through said print wiring based on a magnitude of said magnetic field detected by said magnetic field detector, wherein said current detector obtains a complex magnetic field from a complex voltage outputted from said magnetic field detector using a predetermined magnetic field calibration table and obtains a complex current carried through said print wiring from said complex magnetic field based on design information on said print wiring and on a distance between said magnetic field detector and said print wiring, thereby calculating the value of a current carried through said print wiring.

12. A semiconductor device evaluation apparatus according to claim 11, wherein said current detector comprises a current spectrum calculator which outputs a current spectrum of said complex current.

13. A semiconductor device evaluation apparatus according to claim 11, wherein said current detector comprises a current time waveform calculator which outputs a current time waveform of said complex current.

14. A semiconductor device evaluation apparatus according to claim 11, wherein said current detector comprises:

a current spectrum calculator which outputs a current spectrum of said complex current; and a current time waveform calculator which outputs a current time waveform of said complex current, said semiconductor device evaluation apparatus further comprising:

a comparator which compares said current spectrum or said current time waveform with a predetermined threshold; and a determiner which determines whether said semiconductor device satisfies a predetermined specification based on a comparison result of said comparator.

* * * * *